(12) United States Patent
Hshieh (10) Patent No.: US 7,646,058 B2
(45) Date of Patent: Jan. 12, 2010

(54) DEVICE CONFIGURATION AND METHOD TO MANUFACTURE TRENCH MOSFET WITH SOLDERABLE FRONT METAL

(75) Inventor: Fwu-Iuan Hshieh, Saratoga, CA (US)

(73) Assignee: Force-MOS Technology Corporation (KY)

( * ) Notice: Subject to any disclaimer, the term of this patent is extended or adjusted under 35 U.S.C. 154(b) by 230 days.

(21) Appl. No.: 11/810,327

(22) Filed: Jun. 5, 2007

(65) Prior Publication Data
US 2008/0303081 A1    Dec. 11, 2008

(51) Int. Cl.
H01L 29/732 (2006.01)
H01L 27/088 (2006.01)
(52) U.S. Cl. .................. 257/328; 257/329; 257/382; 257/E29.118; 257/E29.201; 257/E29.257
(58) Field of Classification Search .................. 257/328, 257/329, 382, E29.118, E29.201, E29.257
See application file for complete search history.

(56) References Cited

U.S. PATENT DOCUMENTS 6,144,065 A * 11/2000 Kinzer ....................... 257/327

2002/0019099 A1 * 2/2002 Williams et al. ............ 438/270
2006/0113664 A1 * 6/2006 Shiraishi et al. ............. 257/723

* cited by examiner

Primary Examiner—Ngan Ngo
Assistant Examiner—Benjamin Tzu-Hung Liu
(74) Attorney, Agent, or Firm—Bo-In Lin (57) ABSTRACT

A vertical semiconductor power device includes a plurality of semiconductor power cells connected to a bottom electric terminal disposed on a bottom surface of a semiconductor substrate and at least a top electrical terminal disposed on a top surface of the substrate and connected to the semiconductor power cells. The top electrical terminal further includes a solderable front metal for soldering to a conductor for providing an electric connection therefrom. In an exemplary embodiment, the conductor soldering to the solderable front metal includes a conductor of a high-heat-conductivity metal plate. In another exemplary embodiment, the conductor soldering to the solderable front metal includes a copper plate. In another exemplary embodiment, the solderable front metal includes a Ti/Ni/Au front metal. In another exemplary embodiment, the solderable front metal includes a Ti/Ni/Ag front metal.

17 Claims, 13 Drawing Sheets

DEVICE CONFIGURATION AND METHOD TO MANUFACTURE TRENCH MOSFET WITH SOLDERABLE FRONT METAL

BACKGROUND OF THE INVENTION

1. Field of the Invention

This invention relates generally to the cell structure, device configuration and fabrication process of power semiconductor devices. More particularly, this invention relates to a novel and improved device configuration and processes to manufacture trench MOSFET device with solderable front metal.

2. Description of the Related Art

Conventional configurations of the trench semiconductor power devices in providing front metal as source metal contact and gate pad are confronted with the technical difficulties that the device configurations have limited capabilities of thermal conduction. The thermal conduction issues become even more pronounced when the semiconductor power devices are manufactured with reduced die size.

Figure 1A:
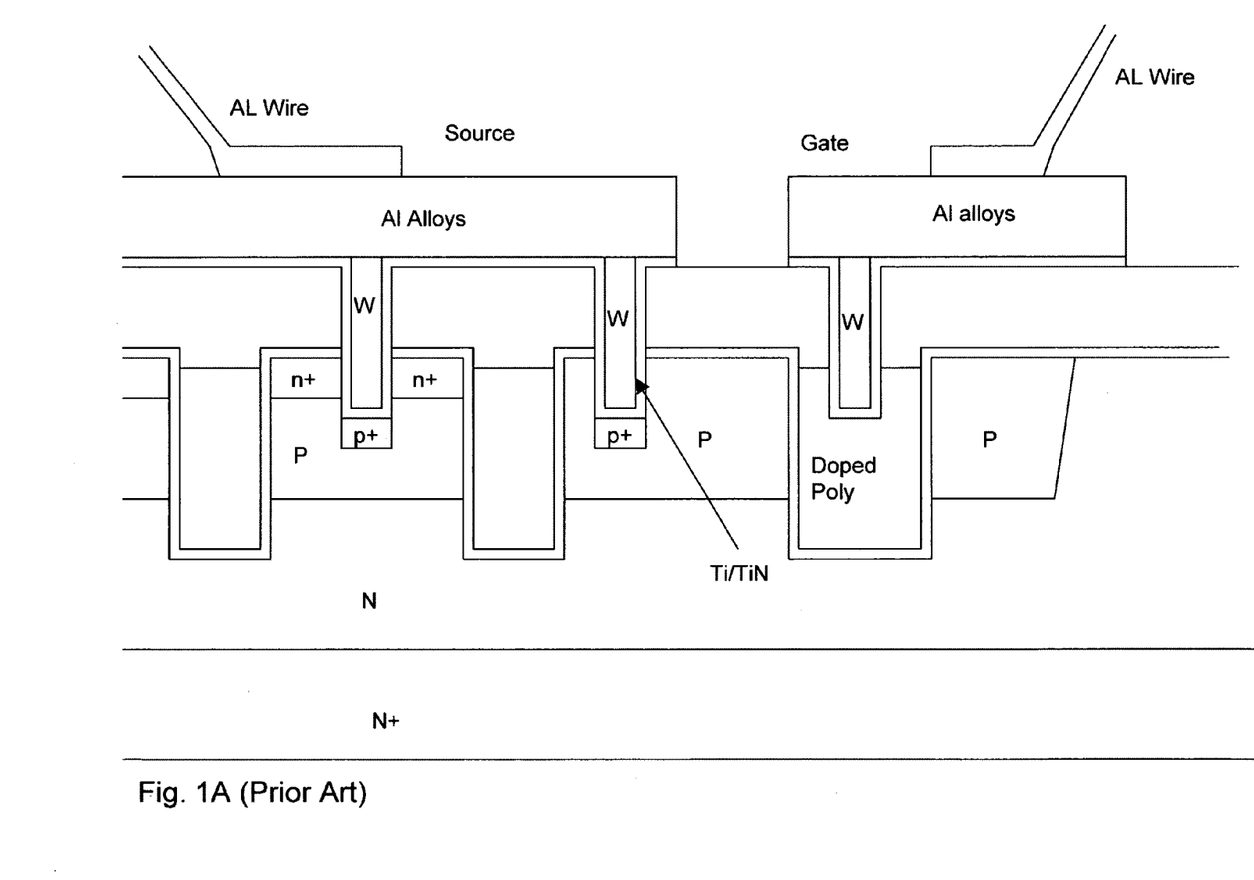
FIGS. 1A and 1B are side cross sectional view and top view respectively of a conventional MOSFET device.
Figure 1B:
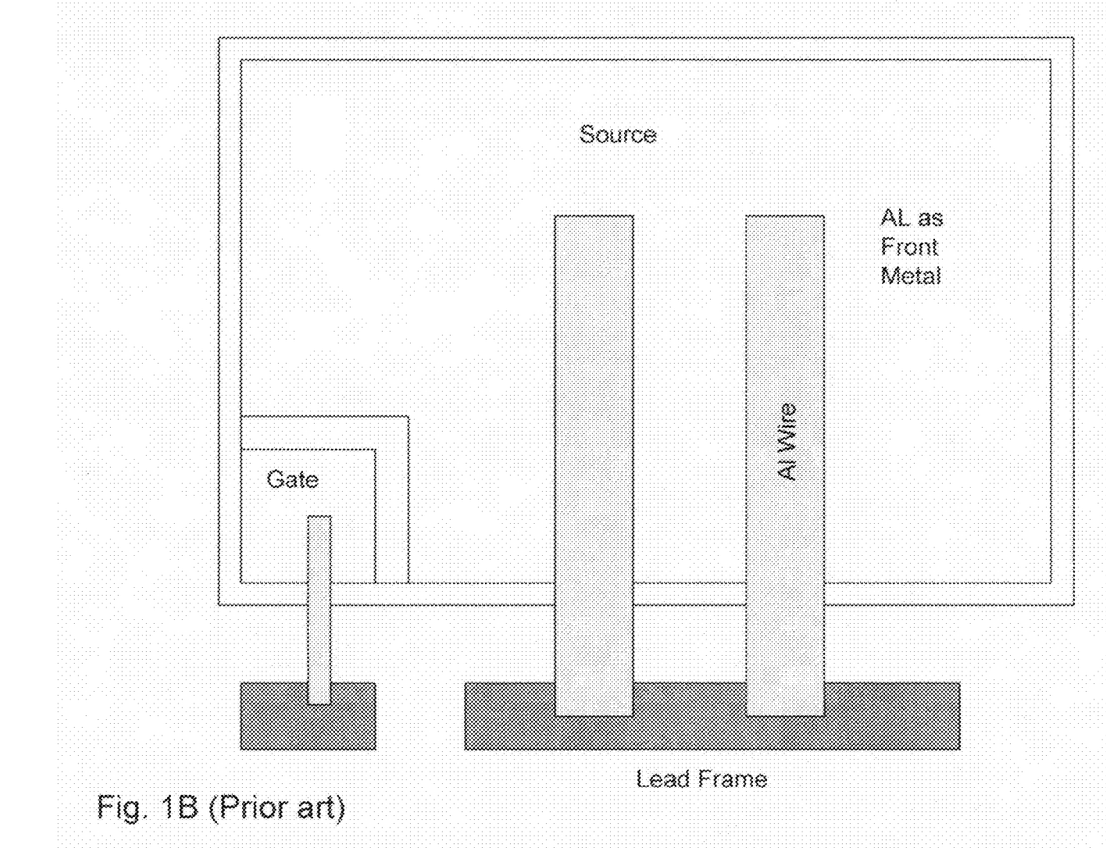

Referring to FIGS. 1A and 1B for a side cross sectional view and top view of a device configuration as disclosed in U.S. Pat. Nos. 6,462,376 and 6,888,196 where the trench MOSFET devices have two dimensional source contact implemented with the tungsten plugs that extend into the source/body regions. The source metal contact is then electrically connected to the front metal composed of aluminum alloys. Aluminum wires are then formed on top of the front metal-layer composed of aluminum alloys. The thermal conduction of such device is limited when the die size is reduced due to an increase in the cell density. The thermal conduction path in a device shown in FIGS. 1A and 1B is through the back-metal (not shown) formed on N+ substrate with the heat conducted through the silicon, the tungsten plug, the aluminum front metal, and the aluminum wire to lead frame. The reduction in device die size results in less silicon area to transfer the heat generated during the times when the device is turned on. Moreover, the conventional aluminum wire bonding cannot provide adequate contact area to the front metal to efficiently transfer the heat to the lead frame. For these reasons, conventional device configurations of the semiconductor power devices encounter a technical limitation that would limit the device performances due the heat conduction difficulties, especially when the cell density is increased with the decreased die size.

As more semiconductor power devices are employed in portable devices, the die size for manufacturing the semiconductor power devices is further reduced and the cell density increased. Therefore, an urgent demand now exists in the art of designing and manufacturing semiconductor power devices to provide new and improved device configuration to resolve such limitations.

SUMMARY OF THE PRESENT INVENTION

It is therefore an aspect of the present invention to provide new and improved semiconductor power device configuration and manufacture processes for providing semiconductor power devices with Ti/Ni/Ag or Ti/Ni/Au as solderable front metal for copper plate assembly to improve both the on-resistance and the thermal conductivity such that the difficulties and limitations discussed above can be overcome.

Another aspect of the present invention is to provide new and improved semiconductor power device configuration and manufacture processes by implementing the copper plate as the front metal for the semiconductor power device. The copper plate provides much better thermal conduction in comparison with aluminum resulted from much wider contact area to the solder front metal and about two times higher thermal conductivity in the copper plate than aluminum. Moreover, the on-resistance (Rds) of the device contributed from contact resistance between copper plate and the solder front metal is about three times lower than that aluminum wires to aluminum front metal due to increase in the contact area and improved electric conductivity in copper plate than aluminum wires.

Another aspect of the present invention is to provide new and improved semiconductor power device configuration and manufacture processes for providing semiconductor power devices with (More are to be added here later if there are more advantages) can be enhanced.

Another aspect of the present invention is to provide new and improved semiconductor power device configuration and manufacture processes for providing semiconductor power devices with (More are to be added here later if there are more advantages) such that improved device performance is achieved.

Another aspect of the present invention is to provide new and improved semiconductor power device configuration and manufacture processes for providing semiconductor power devices with (More are to be added here later if there are more advantages) device performance improvements are achieved.

Briefly, in a preferred embodiment, the present invention discloses a vertical semiconductor power device that includes a plurality of semiconductor power cells connected to a bottom electric terminal disposed on a bottom surface of a semiconductor substrate and at least a top electrical terminal disposed on a top surface of the substrate and connected to the semiconductor power cells. The top electrical terminal further includes a solderable front metal for soldering to a conductor for providing an electric connection therefrom. In an exemplary embodiment, the conductor soldering to the solderable front metal includes a conductor of a high-heat-conductivity metal plate. In another exemplary embodiment, the conductor soldering to the solderable front metal includes a copper plate. In another exemplary embodiment, the solderable front metal includes a Ti/Ni/Au front metal. In another exemplary embodiment, the solderable front metal includes a Ti/Ni/Ag front metal. In another exemplary embodiment, the solderable front metal includes a solderable source front metal and a solderable gate metal with a drain terminal disposed on the bottom surface of the semiconductor substrate. In another exemplary embodiment, the gate metal with a drain terminal disposed on the bottom surface of the semiconductor substrate. And, the conductor soldering to the solderable front metal includes a copper plate soldered onto the source front metal. In another exemplary embodiment, the solderable front metal includes a solderable source front metal and a solderable gate metal with a drain terminal disposed on the bottom surface of the semiconductor substrate. And, the conductor soldering to the solderable front metal includes gold wires soldered onto the gate front metal. In another exemplary embodiment, the semiconductor power device further includes a trench metal oxide semiconductor field effect transistor (MOSFET) device including a trench gate surrounded by a source region encompassed in a body region above a drain region disposed on a bottom surface of the semiconductor substrate. In another exemplary embodiment, the semiconductor power device further includes a source/body contact trench opened through an insulation layer covering the trench MOSFET device extending into the semiconductor substrate for contacting the source and body regions filled with a barrier metal and a tungsten plug electrically connecting to the solderable front metal as a source metal disposed on top of the insulation layer. In another exemplary embodiment, the semiconductor power device further includes a gate contact trench opened through an insulation layer covering the trench MOSFET device extending into the trench gate and filled with a barrier metal and a tungsten plug and electrically connecting to the solderable front metal as a gate pad disposed on top of the insulation layer. In another exemplary embodiment, the semiconductor power device further includes a source/body contact trench opened through an insulation layer covering the trench MOSFET device extending into the semiconductor substrate for contacting the source and body regions filled with a Ti/TiN barrier metal and a tungsten plug electrically connecting to the solderable front metal as a source metal disposed on top of the insulation layer. In another exemplary embodiment, the semiconductor power device further includes a gate contact trench opened through an insulation layer covering the trench MOSFET device extending into the trench gate and filled with a Ti/TiN barrier metal and a tungsten plug and electrically connecting to the solderable front metal as a gate pad disposed on top of the insulation layer. In another exemplary embodiment, the trench gate is further padded by a single gate oxide layer on sidewalls and padded by a bottom surface of the trench. In another exemplary embodiment, the trench gate is further padded by a single gate oxide layer on sidewalls and padded by a thicker gate oxide on a bottom surface of the trench, thicker than the single oxide on the sidewalls. In another exemplary embodiment, the solderable front metal includes a solderable source front metal and a solderable gate metal patterned by applying a metal lift-off process. In another exemplary embodiment, the solderable front metal includes a solderable source front metal and a solderable gate metal patterned by applying a dry-etch process.

These and other objects and advantages of the present invention will no doubt become obvious to those of ordinary skill in the art after having read the following detailed description of the preferred embodiment, which is illustrated in the various drawing figures.

DETAILED DESCRIPTION OF THE PREFERRED EMBODIMENT

Figure 2A:
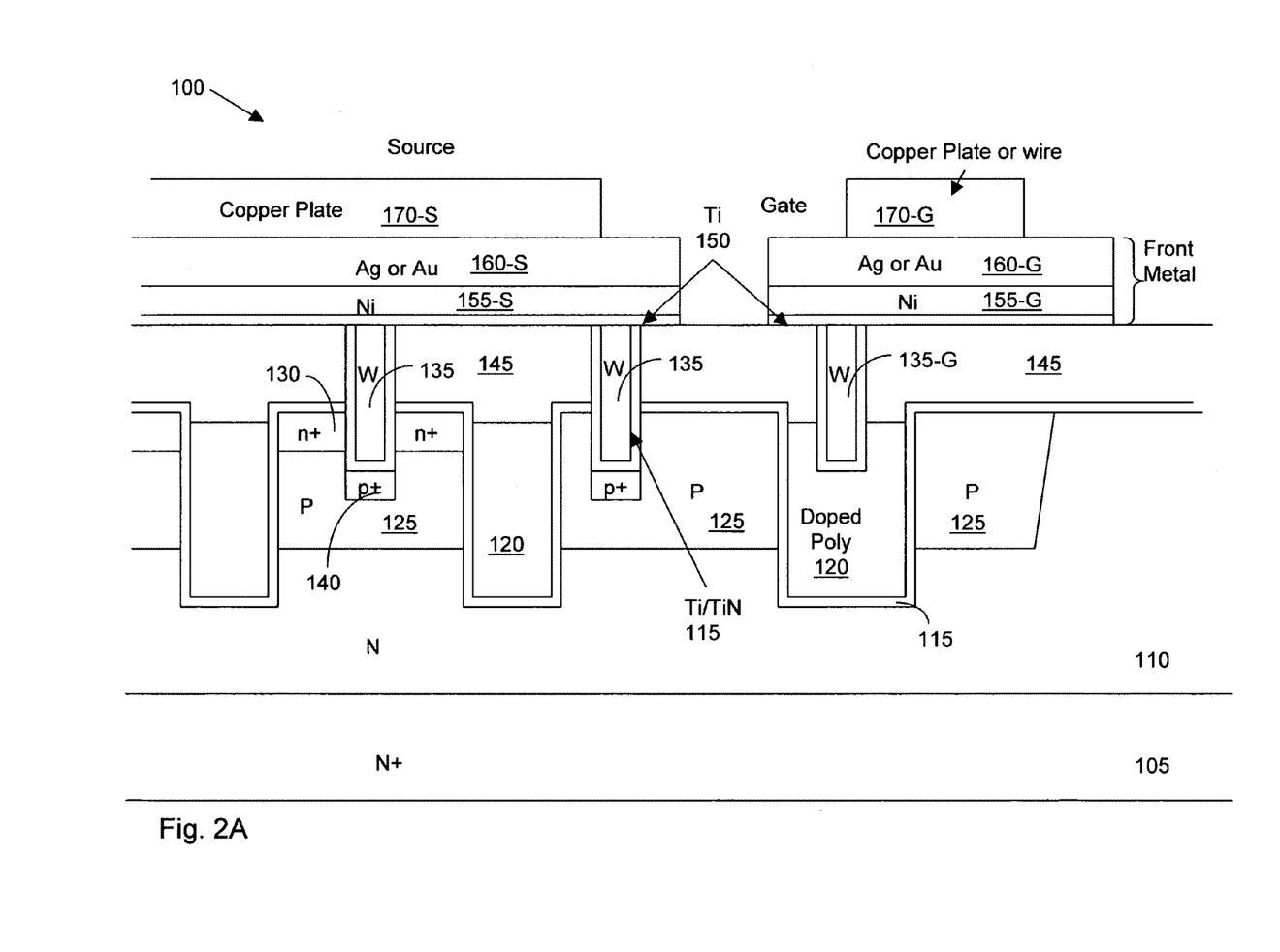
FIGS. 2A and 2B are side cross sectional view and top view respectively of an improved device of this invention with solderable front metal for soldering copper plate thereon to improve thermal conductivity and reduce on-resistance.
Figure 2B:
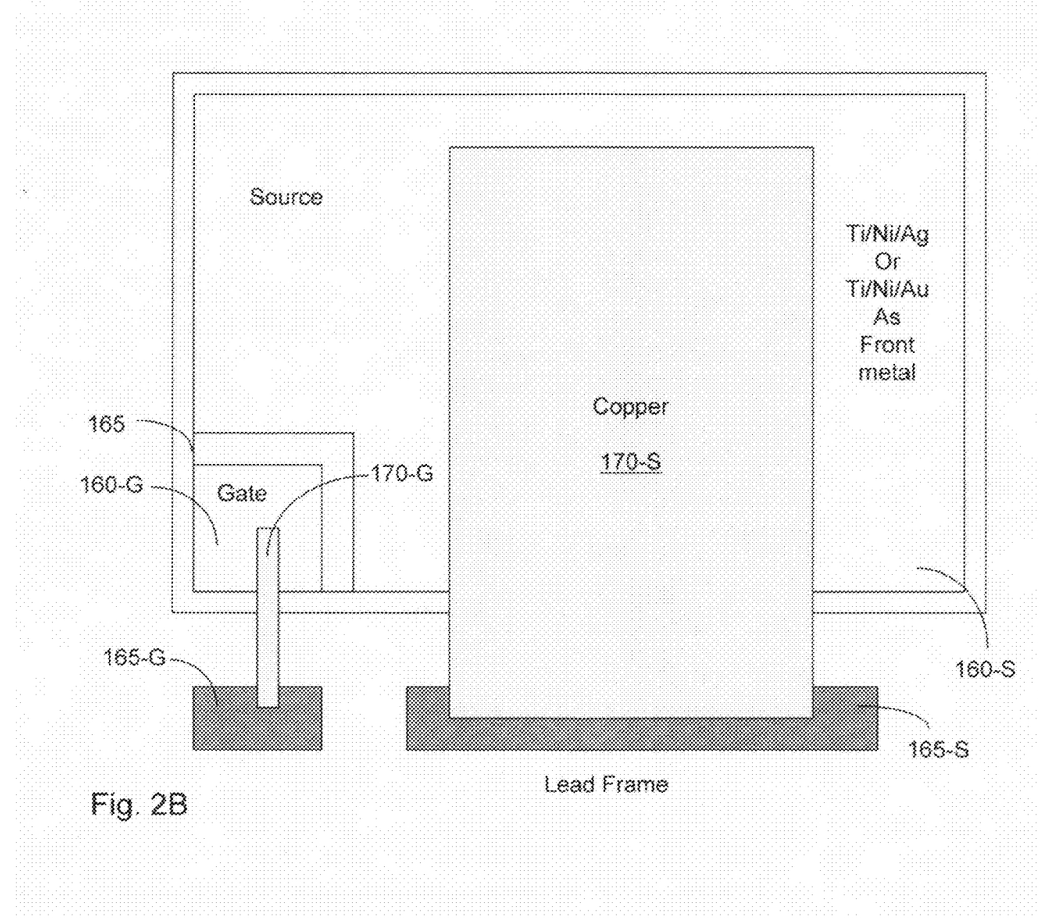

Please refer to FIGS. 2A and 2B for a side cross-sectional view and a top view of a trench MOSFET 100 with improved front metal configuration of this invention. The trenched MOSFET 100 is supported on a substrate 105 formed with an epitaxial layer 110. The MOSFET device 100 includes trenched gates 120 disposed in a trench with a gate insulation layer 115 formed over the walls of the trench. A body region 125 that is doped with a dopant of second conductivity type, e.g., P-type dopant, extends between the trenched gates 120. The P-body regions 125 encompassing a source region 130 doped with the dopant of first conductivity, e.g., N+ dopant. The source regions 130 are formed near the top surface of the epitaxial layer surrounding the trenched gates 120. In order to improve the source/body contact, a P+ dopant region 140 is formed at the bottom of the source/body contact trenches 135 opened through an overlying insulation layer 145 and filled with tungsten surrounded by a Ti/TiN barrier layer. A gate contact trench 135-G is also opened through the insulation layer 145 into the trenched gate 120 and also filled with tungsten contact plug surrounded by a Ti/TiN barrier layer. A low resistance layer 150 composed of Ti or Ti/TiN that has a large contact area to the tungsten trench contact 135 and 135-G to reduce the resistance. A new and improved solderable front metal layer composed of a nickel layer 155 and an Ag or Au layer 160 are formed and patterned on top of the low resistance layer 150 into 155-S and 160-S to contact the source contact plug 135 and 155-G and 160-G to contact the gate contact plug 135-G. A source copper plate 170-S and a gate copper plate or wire, or gold wire 170-G are formed on top of the solderable front metal layer to contact the leadframe 165-S and 160-G as that shown in FIG. 2B.

As shown in FIG. 2B, the top of the device are formed with the solderable front metal 160-S and 160-G for contacting the source and the gate respectively and also a metal gap 165 between the front metals 160-S and 160-G. A copper plate 170-S can be directly soldered to the solderable front metal layer 160-S composed of Ti/Ni/Ag or Ti/Ni/Au to greatly enhance thermal conductivity and further to reduce the on-resistance.

Figure 3:
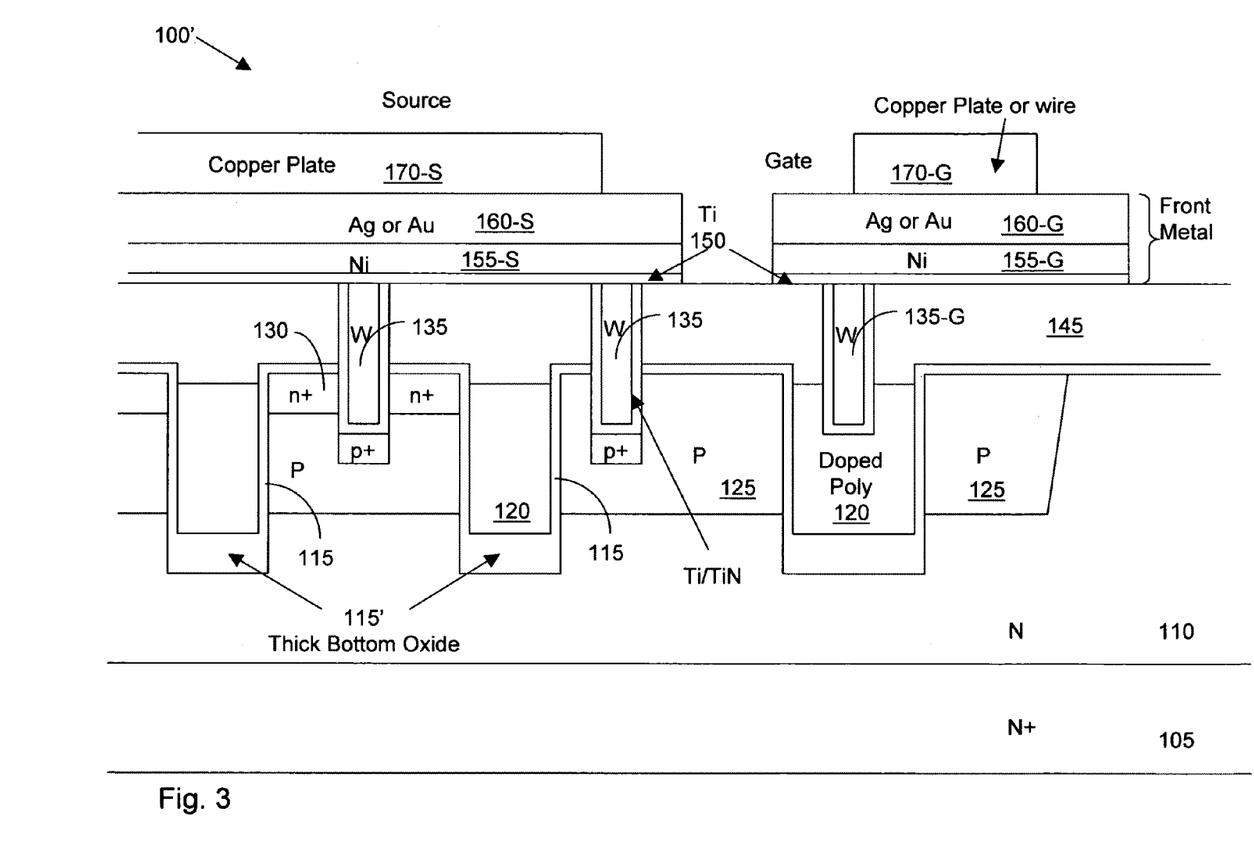
FIG. 3 is a side cross sectional view of another embodiment of this invention with solderable front metal for soldering copper plate thereon to improve thermal conductivity and reduce on-resistance and further has a thick bottom oxide layer on the trench bottom to reduce a gate-drain capacitance.

Please refer to FIG. 3 for a side cross-sectional view of a trench MOSFET 100' with improved front metal configuration of this invention. The trenched MOSFET 100' is supported on a substrate 105 formed with an epitaxial layer 110. The MOSFET device 100 includes trenched gates 120 disposed in a trench with a gate insulation layer 115 formed over the sidewalls of the trench. The trench gate further has a thicker bottom oxide layer 115' on the bottom surface of the trench to reduce the gate-drain capacitance thus improving the switching performance. A body region 125 that is doped with a dopant of second conductivity type, e.g., P-type dopant, extends between the trenched gates 120. The P-body regions 125 encompassing a source region 130 doped with the dopant of first conductivity, e.g., N+ dopant. The source regions 130 are formed near the top surface of the epitaxial layer surrounding the trenched gates 120. In order to improve the source/body contact, a P+ dopant region 140 is formed at the bottom of the source/body contact trenches 135 opened through an overlying insulation layer 145 and filled with tungsten surrounded by a Ti/TiN barrier layer. A gate contact trench 135-G is also opened through the insulation layer 145 into the trenched gate 120 and also filled with tungsten contact plug surrounded by a Ti/TiN barrier layer. A low resistance layer 150 composed of Ti or Ti/TiN that has a large contact area to the tungsten trench contact 135 and 135-G to reduce the resistance. A new and improved solderable front metal layer composed of a nickel layer 155 and an Ag or Au layer 160 are formed and patterned on top of the low resistance layer 150 into 155-S and 160-S to contact the source contact plug 135 and 155-G and 160-G to contact the gate contact plug 135-G. A source copper plate 170-S and a gate copper plate or wire, or gold wire 170-G are formed on top of the solderable front metal layer to contact the leadframe 165-S and 160-G similar as that shown in FIG. 2B.

The MOSFET devices with solderable front metal, as shown in FIGS. 2A, 2B and 3, provides additional benefits because the structure as shown can be achieved with simpler and more cost effective process such as application of E-beam evaporation or sputtering deposition for Ti/Ni/Au or Ti/Ni/Ag. These processes are more convenient to apply and more cost effective than prior arts techniques as disclosed by Williams et. al in U.S. Pat. No. 6,043,125 and U.S. Pat. No. 6,066,877 which has Ni/Au as solderable metal on top of aluminum front metal by applying a process of electroless plating. The electroless plating process is much more complicate and more expensive than the E-beam evaporation or sputtering deposition when a copper plate is employed as shown in FIGS. 2 and 3. The devices disclosed in this invention do not include an aluminum metal layer as the front metal thus providing additional benefit of higher heat and electric conductivities. Furthermore, since the solderable metal system (Ti/Ni/Ag) has been widely applied to the two-terminal Schottky diode that includes a Ti/Ni/Ag layer on top of Schottky barrier layer, the metal-layer processing technologies are commonly practiced with highly reliable performance. Such benefits are readily available as now disclosed in this invention though a solderable front metal combined with copper plate employed in manufacturing the semiconductor power device such as a trench MOSFET with tungsten plug underneath the solderable front metal.

Figure 4A:
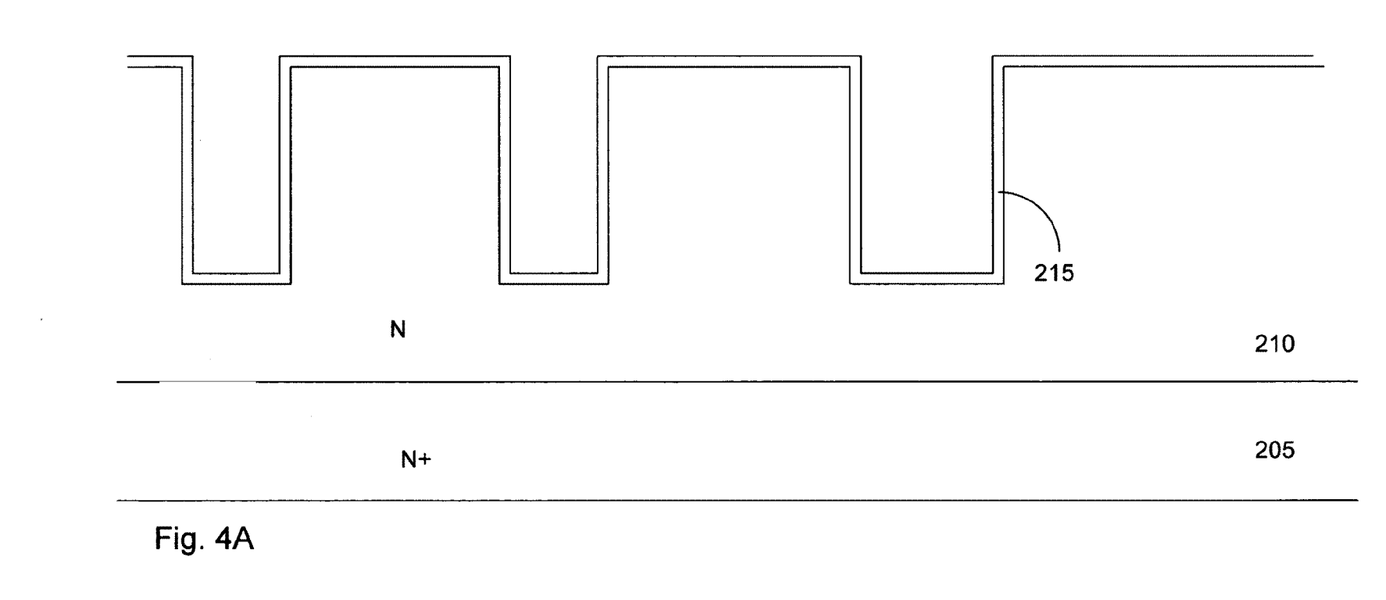
FIGS. 4A to 4H are a serial of side cross sectional views for showing the processing steps for fabricating a MOSFET device as shown in FIGS. 2 to 3 of this invention.
Figure 4B:
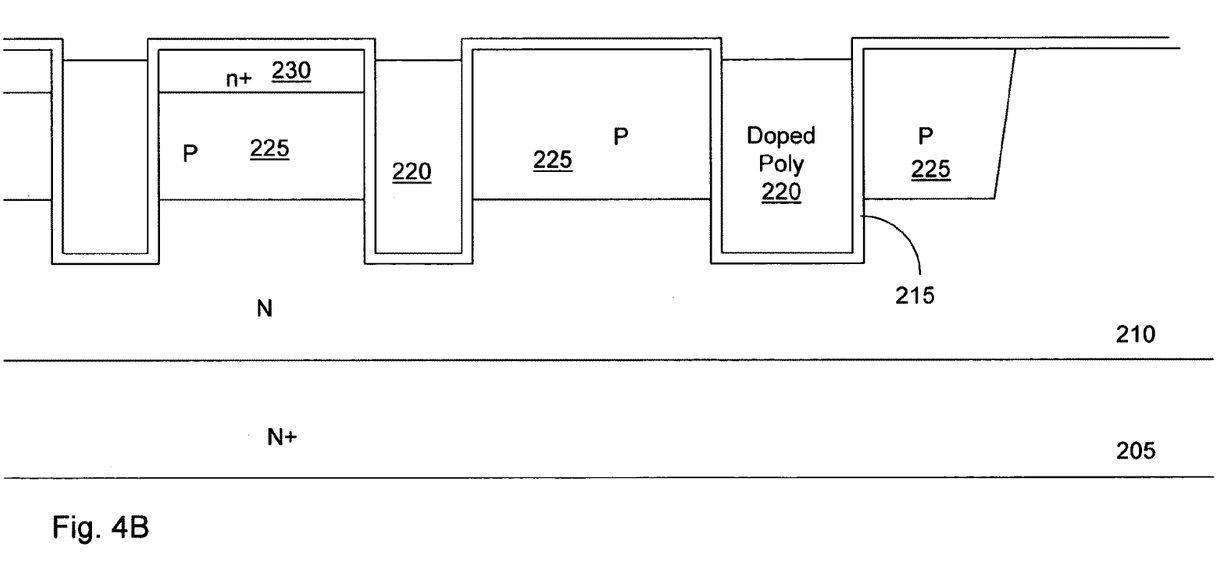
Figure 4C:
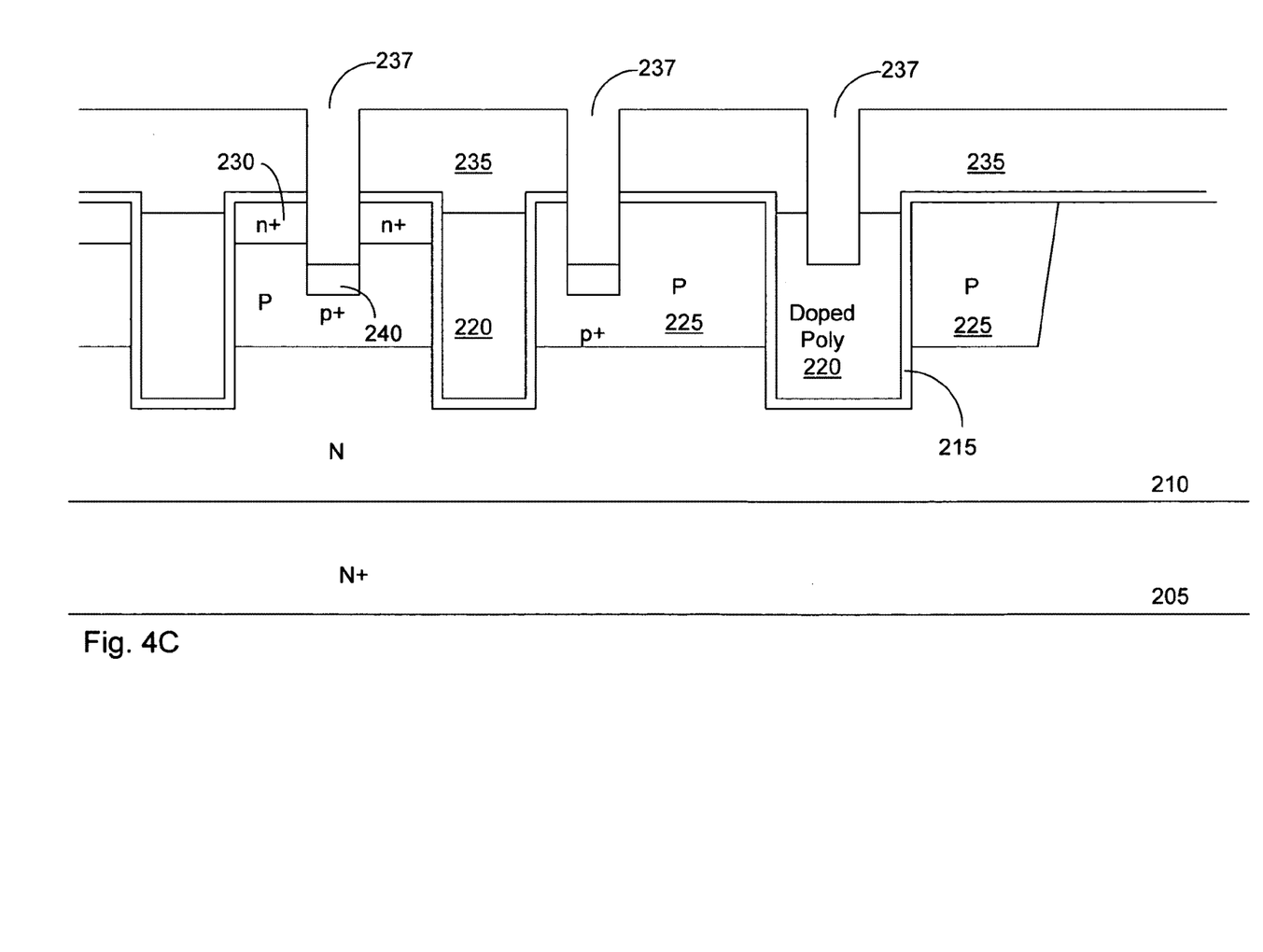

Referring to FIGS. 4A to 4F for a serial of side cross sectional views to illustrate the fabrication steps of a MOSFET device as that shown in FIGS. 2 and 3. In FIG. 4A, a trench mask (not shown) is applied to open a plurality of trenches in an epitaxial layer 210 supported on a substrate 205 by employing a dry silicon etch process. An oxidation process is then performed to form an oxide layer covering the trench walls. The trench is oxidized with a sacrificial oxide to remove the plasma damaged silicon layer during the process of opening the trench. Then an oxide layer 215 is grown. Refer to FIG. 4B wherein the manufacturing processes continue with a step of depositing a polysilicon layer 220 to fill the trench and covering the top surface and then doped with an N+ dopant. The polysilicon layer 220 filling the trenches are either etched back or removed by applying a chemical mechanical planarization process (CMP) to remove the polysilicon above the top surface. Then, the manufacturing process proceeds by applying a body mask (not shown) for performing a P-body implant with a P-type dopant. Then an elevated temperature is applied to diffuse the P-body 225 into the epitaxial layer 210. Then the body mask is removed followed by applying a source mask (not shown) for implanting a N+ source dopant to form the source regions 230 followed by applying an elevated temperature to diffuse the source regions 230 further into the body region 225. In FIG. 4C, an oxide deposition is then carried out to form a thick oxide layer 235 covering over the top surface of the device. Then, a dry contact oxide etch is carried out with a contact etch mask (not show) to open trenches 237 through the oxide layer 235 into the body regions 225 between the trenched gates 220. Then a boron ion implantation is carried out to form P+ region 240 below the trenches 237 as doped metal contact regions.

Figure 4D:
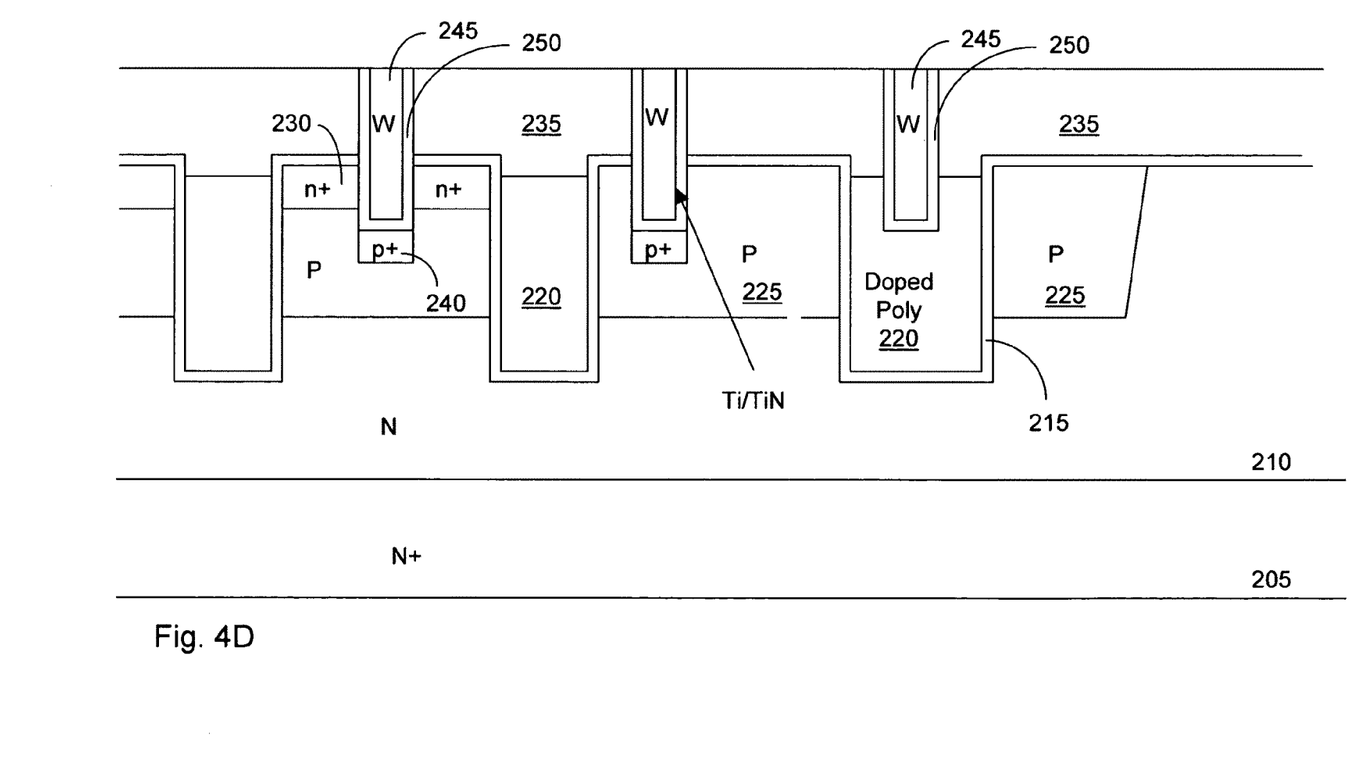
Figure 4E:
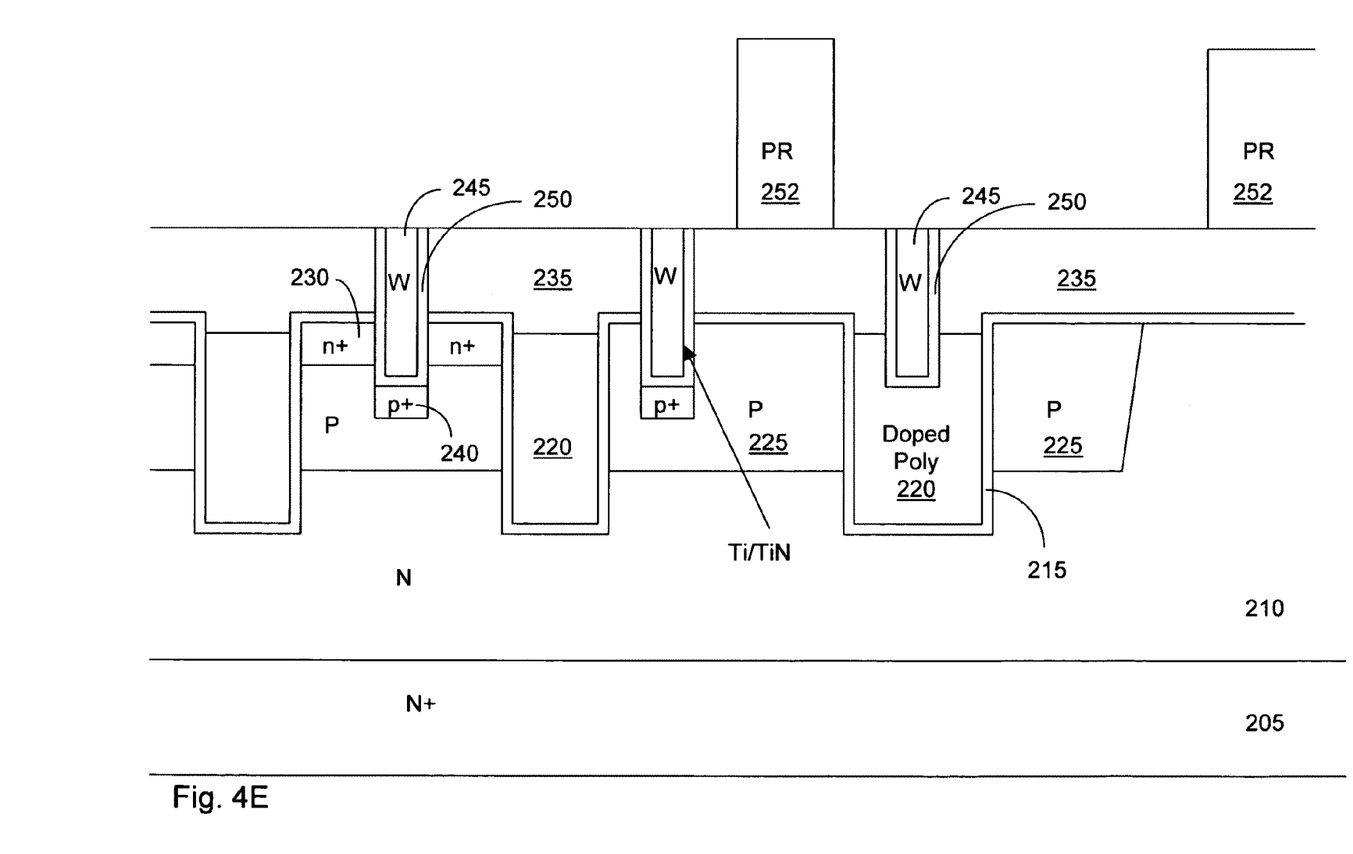
Figure 4F:
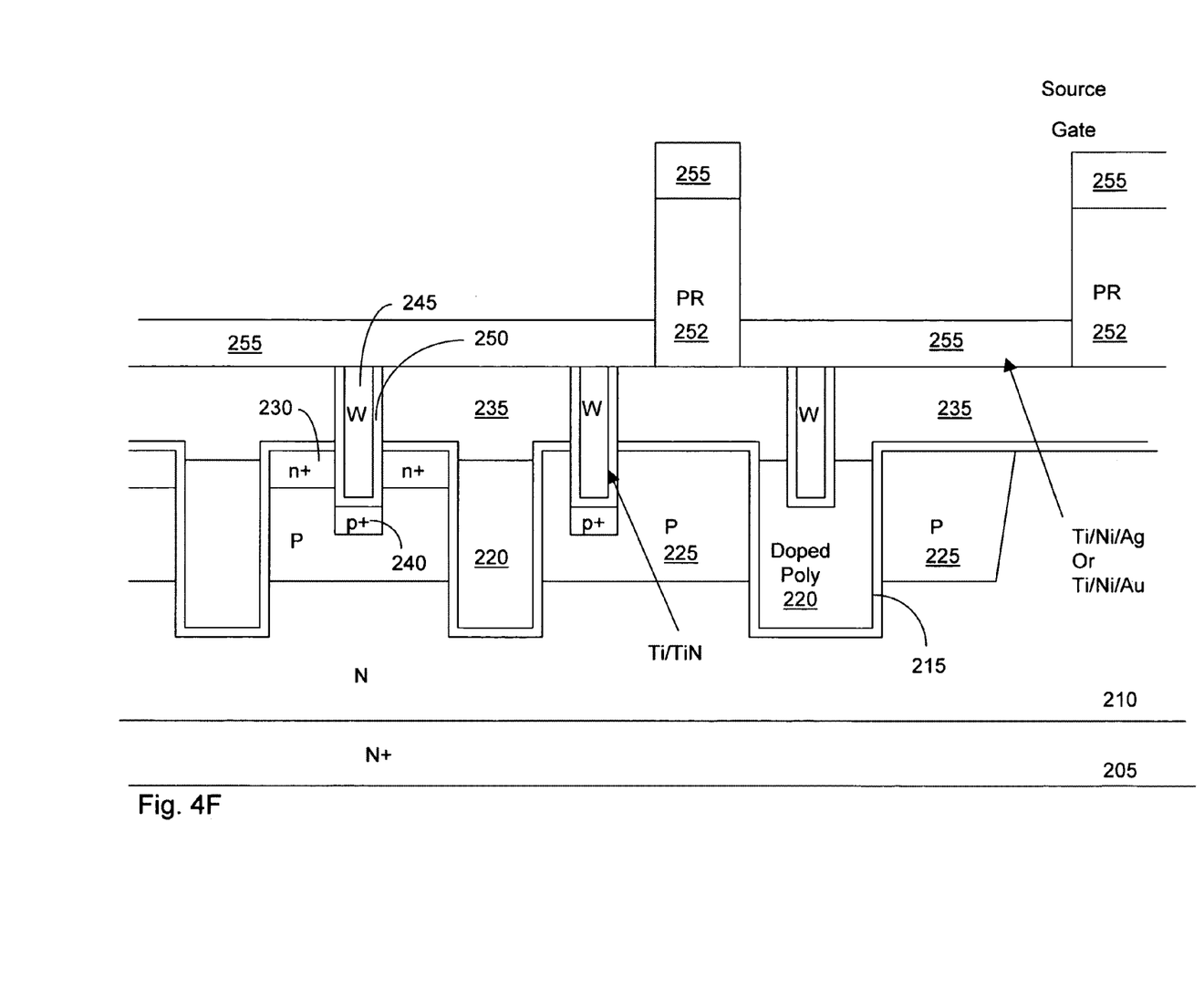
Figure 4G:
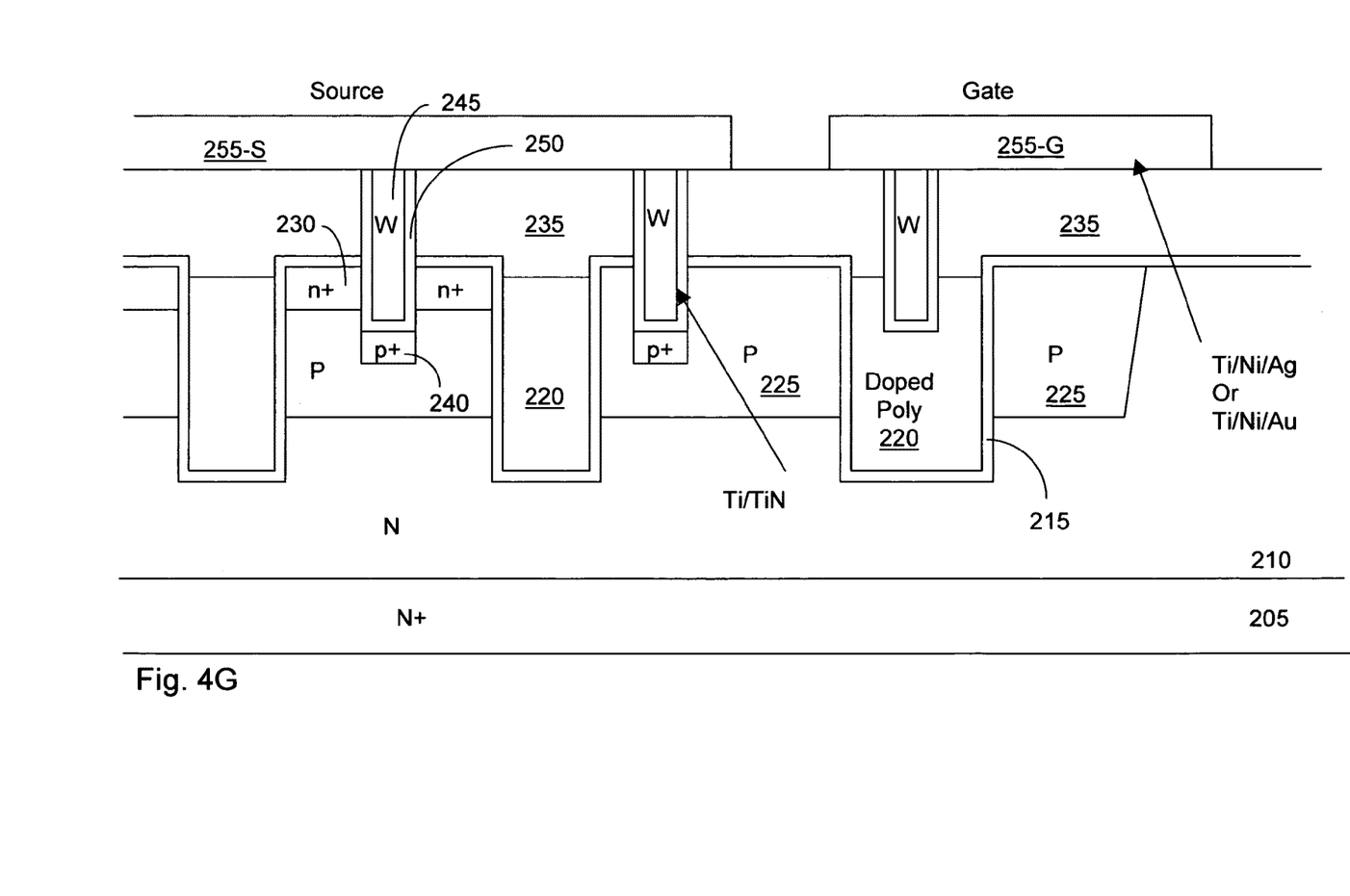
Figure 4H:
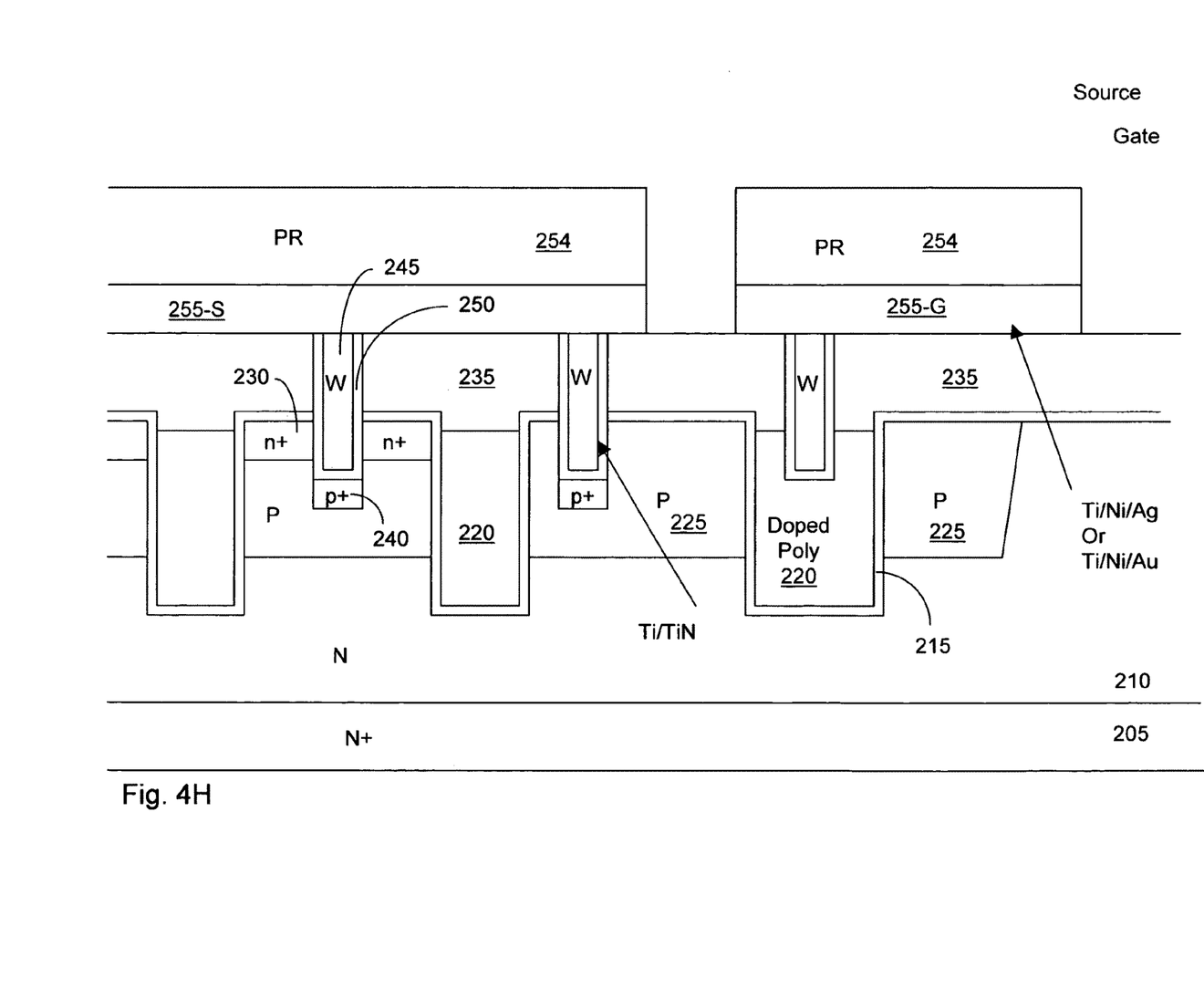

In FIG. 4D, a Ti/TiN/W is deposited into the metal contact trenches 230 to form tungsten plugs 245 surrounded with Ti/TiN barrier layer 250. Then two etch back processes of tungsten and also of Ti/TiN are carried out. In FIG. 4E, a photo resist deposition is carried out to form a photo resist 252 on top of the insulation layer 235 by metal-mask and exposure wherein the metal mask is used to form PR 252 as shown in 4E. This is non-conventional way to pattern the metal: and generally referred to as a "lift-off" process). In FIG. 4F, a Ti/TiN/Ag or Ti/TiN/Au deposition is carried out to form the solderable front metal layer 255. In FIG. 4G, the photo-resist etch is carried out to remove the front metal 255 on top of the photo resist by applying a lift-off process during the photo-resist etch followed by removing the photo resist 252. The "lift-off" process is easier to implement for manufacturing than the solderable metal etch process as further described in FIG. 4G' below. The advantages of the lift-off process can be further understood from the facts that the solderable front metal as disclosed may include heavy metals such as Ni, Au or Ag. These heavy metals are not allowed in conventional foundries for VLSI or ULSI CMOS process. This is due to the fact that the heavy metals will kill lifetime of both electron and hole, and create silicon defect during oxidation and diffusion cycles. Therefore, the solderable metal deposition and etch must be carried out at separated place with metal mask alignment capability separated from the foundries for the CMOS processes to avoid the heavy metal contamination. The solderable front metal deposition can be performed at back-metal houses since the back-metal is also solderable metal such as Ti/Ni/Ag or Cr/Ni/Ag. However, the back-metal houses normally do not have mask alignment capability. For these reasons, in comparison with the "lift-off" process, the metal mask alignment with exposure can be done prior to the solderable metal deposition at CMOS foundries without causing heavy metal contamination while the solderable front metal deposition and lift-off process done at same place for front and back-metal deposition without requiring additional mask alignment capability at the back-metal houses.

Alternatively, instead of the lift-off processes, referring to FIG. 4G' for a different process in the formation and patterning of the front metal by applying metal etch with metal mask. The Ti/TiN/Ag or Ti/TiN/Au layer 255 is first deposited, then a metal mask 254 is applied. A metal etch is carried out to pattern the front metal into source front metal 255-S and gate front metal 255-G followed by stripping the photo resist 254. Before copper plate is soldered to the solderable front metal, either solder wire or paste with 93.5% Pb/5% Sn/1.5% Ag content is applied to the solderable front metal followed by soldering the copper plate to the solderable front meal.

According to the above drawings and descriptions, this invention further discloses a method for manufacturing a vertical semiconductor power device comprising a plurality of semiconductor power cells connected to a bottom electric terminal disposed on a bottom surface of a semiconductor substrate and at least a top electrical terminal on a top surface of the substrate connected to the semiconductor power cells. The method further includes a step of forming the top electrical terminal as a solderable front metal. In an exemplary embodiment, the step of forming the top electrical terminal as a solder front metal further includes a step of applying a lift-off process by first depositing a photo resist (PR) layer on top of an insulation layer overlying the top surface of the substrate and applying a metal mask to pattern the PR layer followed by depositing the solderable front metal then remove the solderable metal from the top of the PR layer and etching off the PR layer whereby the solderable front metal is formed together with a back-metal as the bottom electric terminal composed also of a solderable metal. In another exemplary embodiment, the step of depositing the solderable front metal further includes a step of depositing a solderable a Ti/TiN/Ag layer. In another exemplary embodiment, the step of depositing the solderable front metal further includes a step of depositing a solderable a Ti/TiN/Au layer. In another exemplary embodiment, the step of applying a metal mask to pattern the PR layer further includes a step of applying a CMOS process in a VLSI/ULSI foundry. In another exemplary embodiment, the step of applying a metal mask to pattern the PR layer further includes a step of applying a CMOS process in a VLSI/ULSI foundry and carrying out a step of depositing the solder front metal in a back-metal house separated from the VLSI/ULSI foundry and without requiring a metal mask alignment. In another exemplary embodiment, the step of forming the solderable front metal layer further includes a step of first depositing a solderable front metal layer followed by carrying out a metal etch by applying a metal mask to pattern the solderable front metal into the top electric terminal. In another exemplary embodiment, the step of depositing the solderable front metal further includes a step of depositing a solderable a Ti/TiN/Ag layer. In another exemplary embodiment, the step of depositing the solderable front metal further includes a step of depositing a solderable a Ti/TiN/Au layer. In another exemplary embodiment, the method further includes a step of soldering a copper plate onto the solderable front metal. In another exemplary embodiment, the method further includes a step of applying a solder paste followed by soldering a copper plate onto the solderable front metal. In another exemplary embodiment, the method further includes a step of soldering a plurality of conductive wires onto the solderable front metal formed as gate pad on the top surface of the semiconductor power device.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A vertical semiconductor power device comprising a plurality of semiconductor power cells connected to a bottom electric terminal disposed on a bottom surface of a semiconductor substrate and at least a top electrical terminal disposed on a top surface of the substrate and connected to the semiconductor power cells, said semiconductor power device further comprising:
   contact trenches opened through an insulation layer and extended into regions of said power cells wherein said contact trenches are filled with metallic contact plugs providing electrical and thermal conductivity contacts;
   said top electrical terminal further comprising a solderable front metal disposed on top of said insulation layer and contacting said metal plugs penetrated through said insulation layer wherein said metallic contact plugs and said front metal are composed of a metallic material having a thermal conductivity higher than a thermal conductivity of aluminum and/or aluminum alloys and said metallic contact plugs and said from metal comprises a continuous uninterrupted electrical and thermal conductivity conducting path from said semiconductor power device to said front metal.

2. The vertical semiconductor power device of claim 1 wherein:
   said solderable front metal further comprises a solderable metal plate having a thermal conductivity higher than said aluminum or aluminum alloys for soldering to a high-heat-conductivity metal plate to extend said continuous uninterrupted electrical and thermal conductivity conducting path from said semiconductor power device to said front metal.

3. The vertical semiconductor power device of claim 1 wherein:
   said solderable front metal further comprises a solderable metal plate having a thermal conductivity higher than said aluminum or aluminum alloys for soldering to a copper plate to extend said continuous uninterrupted electrical and thermal conductivity conducting path from said semiconductor power device to said copper plate.

4. The vertical semiconductor power device of claim 1 wherein:
   said solderable front metal comprising a Ti/Ni/Au front metal.

5. The vertical semiconductor power device of claim 1 wherein:
   said solderable front metal comprising a Ti/Ni/Ag front metal.

6. The vertical semiconductor power device of claim 1 wherein:
   said solderable front metal comprising a solderable source front metal and a solderable gate metal with a drain terminal disposed on said bottom surface of said semiconductor substrate.

7. The vertical semiconductor power device of claim 1 wherein:
   said solderable front metal comprising a solderable source front metal and a solderable gate metal with a drain terminal disposed on said bottom surface of said semiconductor substrate; and
   a copper plate soldering to said solderable source front metal to extend said continuous uninterrupted electrical and thermal conductivity conducting path from said semiconductor power device to said copper plate.

8. The vertical semiconductor power device of claim 1 further comprising:
   gold wires or copper wires or copper plate soldered onto said solderable front metal to extend said continuous uninterrupted electrical and thermal conductivity conducting path from said semiconductor power device to said gold wires or copper wires of copper plate.

9. The vertical semiconductor power device of claim 1 further comprising:
   a trench metal oxide semiconductor field effect transistor (MOSFET) device including a trench gate surrounded by a source region encompassed in a body region above a drain region disposed on a bottom surface of said semiconductor substrate.

10. The vertical semiconductor power device of claim 9 wherein:
    said contact trenches further comprise a source/body contact trench opened through said insulation layer covering said trench MOSFET device extending into said semiconductor substrate for contacting said source and body regions filled with said metallic contact plugs comprise a barrier metal and a tungsten plug for contacting said solderable front metal as a source metal disposed on top of said insulation layer.

11. The vertical semiconductor power device of claim 9 further comprising:
    said contact trenches further comprise a gate contact trench opened through said insulation layer covering said trench MOSFET device extending into said trench gate and filled with said metallic contact plugs comprise a barrier metal and a tungsten plug for contacting said solderable front metal as a gate pad disposed on top of said insulation layer.

12. The vertical semiconductor power device of claim 9 further comprising:

said contact trenches further comprise a source/body contact trench opened through said insulation layer covering said trench MOSFET device extending into said semiconductor substrate for contacting said source and body regions filled with said metallic contact plugs comprise a Ti/TiN barrier metal and a tungsten plug for contacting said solderable front metal as a source metal disposed on top of said insulation layer.

13. The vertical semiconductor power device of claim 9 further comprising:
said contact trenches further comprise a gate contact trench opened through said insulation layer covering said trench MOSFET device extending into said trench gate and filled with said metallic contact plugs comprise a Ti/TiN barrier metal and a tungsten plug for contacting said solderable front metal as a gate pad disposed on top of said insulation layer.

14. The vertical semiconductor power device of claim 9 wherein:
said trench gate is further padded by a single gate oxide layer on sidewalls and a bottom surface of said trench.

15. The vertical semiconductor power device of claim 9 wherein:
said trench gate is further padded by a single gate oxide layer on sidewalls and padded by a thicker gate oxide on a bottom surface of said trench, thicker than said single oxide on said sidewalls.

16. The vertical semiconductor power device of claim 1 wherein:
said solderable front metal comprising a solderable source front metal and a solderable gate metal patterned by applying a metal lift-off process.

17. The vertical semiconductor power device of claim 1 wherein:
said solderable front metal comprising a solderable source front metal and a solderable gate metal patterned by applying a dry-etch process.

* * * * *